United States Patent [19]

Kirsch

[11] Patent Number: 5,095,347
[45] Date of Patent: Mar. 10, 1992

[54] PLURAL TRANSISTOR SILICON ON INSULATOR STRUCTURE WITH SHARED ELECTRODES

[75] Inventor: Howard C. Kirsch, Austin, Tex.
[73] Assignee: Motorola, Inc., Schaumburg, Ill.
[21] Appl. No.: 561,385
[22] Filed: Aug. 1, 1990
[51] Int. Cl.[5] .............................................. H01L 29/52
[52] U.S. Cl. ..................... 357/23.7; 357/42; 307/303.2
[58] Field of Search .................... 307/357, 303.2; 357/23.7, 42

[56] References Cited

U.S. PATENT DOCUMENTS

| | | | |
|---|---|---|---|
| 4,916,504 | 4/1990 | Nakahara | 357/23.7 X |
| 4,920,392 | 4/1990 | Nishiura | 357/23.7 |
| 4,974,041 | 11/1990 | Grinberg | 357/23.7 |
| 4,999,691 | 3/1991 | Hsu et al. | 357/23.7 |

OTHER PUBLICATIONS

Garnache, "Complementary FET Memory Cell" IBM T.D.B. vol. 18, No. 12, May 1976, pp. 3947-39488 (357/23.7).

Malhi et al, "Characteristics and Three-Dimensional Integration of MOSFET's in Small-Grain LPCVD Polycrystalline Silicon", IEEE T.E.C.D., vol. ED-32, No. 2, Feb. 1985.

Primary Examiner—David Hudspeth
Attorney, Agent, or Firm—Robert L. King

[57] ABSTRACT

A plural transistor structure uses shared electrodes to improve the degree of integration circuits such as SRAMs. The degree of integration is improved by forming a gate of a first transistor from a current electrode, such as a drain of a second transistor with the same region of semiconductor material. Furthermore, a gate of the second transistor can be formed from a drain of the first transistor with the same region of material which dramatically reduces the size of a memory cell latch.

6 Claims, 5 Drawing Sheets

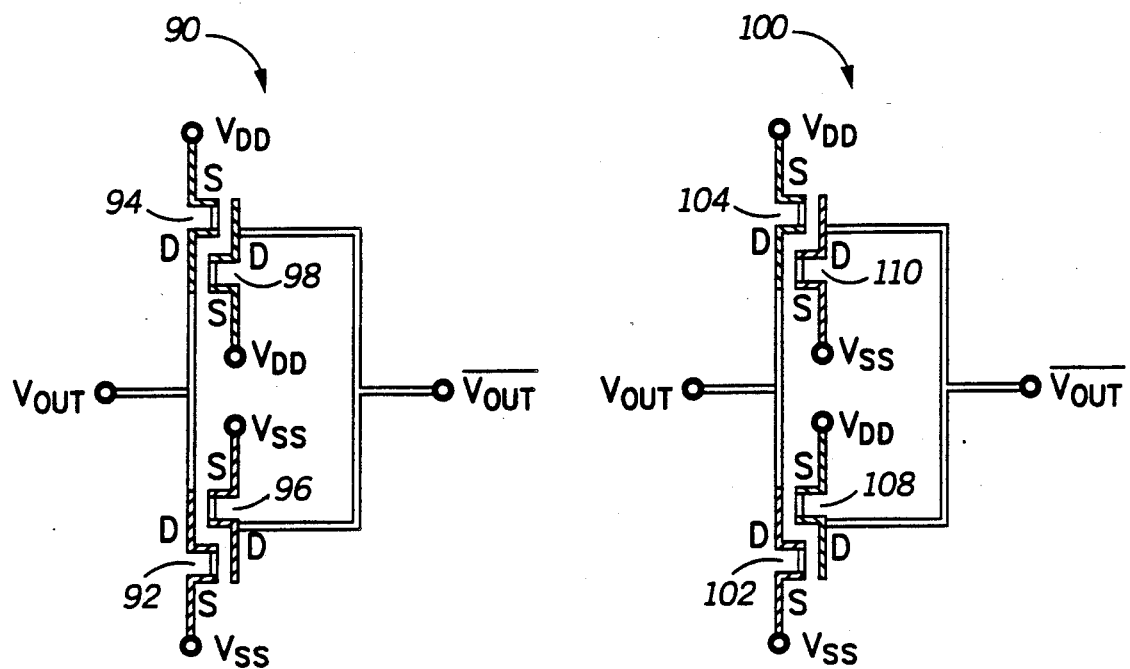
*FIG.5*  *FIG.6*
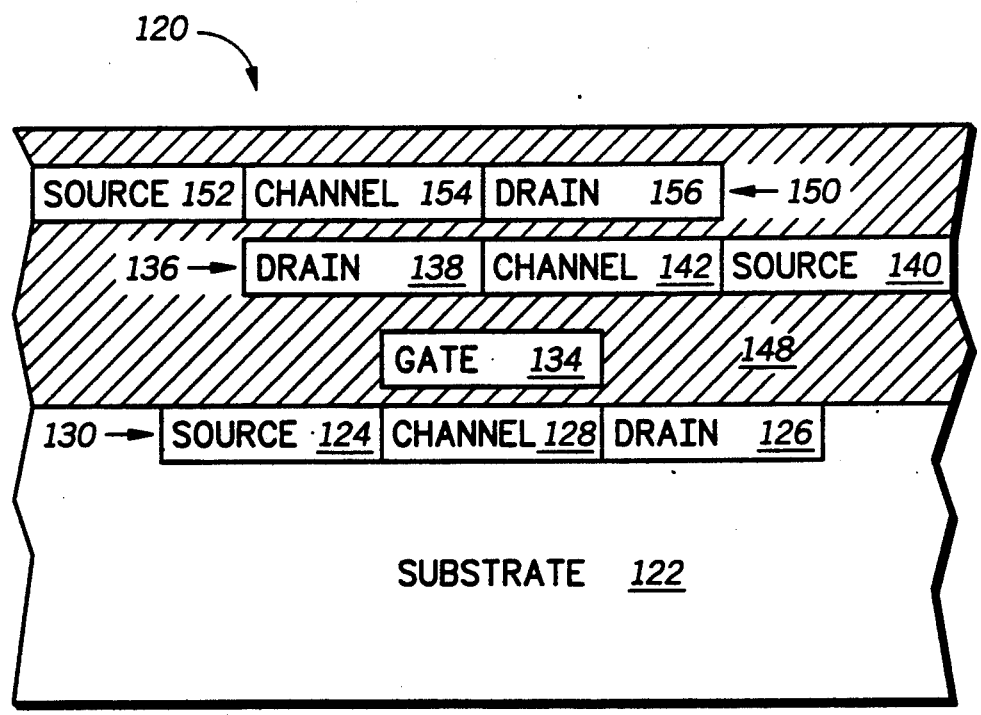
*FIG.7*

PLURAL TRANSISTOR SILICON ON INSULATOR STRUCTURE WITH SHARED ELECTRODES

TECHNICAL FIELD

This invention relates to electronic transistor structures, and more particularly, to structures of a plurality of interconnected transistors.

BACKGROUND OF THE INVENTION

In order to reduce the cost of semiconductor products, particularly memories, it is necessary to increase the degree of integration and miniaturization of the integrated circuits. A comparative study of the scaling between dynamic random access memories, DRAMs, and static random access memories, SRAMs, shows that the degree of integration achieved in SRAMs is less than that achieved in DRAMs.

The degree of integration of DRAMs has been enhanced with the use of improved three-dimensional semiconductor structures. Three dimensional semiconductor structures can be used for isolation purposes, for the integration of capacitors, or for the integration of transistors which are formed either within or above the silicon substrate. Three-dimensional structures formed within a silicon substrate are typically associated with a silicon trench, and structures formed above the silicon substrate are typically formed in overlying layers of polysilicon which may be recrystallized to form single crystal silicon. The overlying layers of silicon, formed in the manner described, are referred to as "silicon-on-insulator" or SOI.

Improvements in the degree of integration of DRAMs have largely been due to a reduction of circuit area required to form memory cell storage capacitors. The memory cell area is typically reduced by either forming capacitors in silicon trenches which are etched into a silicon substrate, or by stacking capacitors overlying a layer of silicon.

SRAM memory cells, in contrast to DRAM memory cells, do not utilize storage capacitors and, therefore, have not benefited from the improvements in DRAM integration. In contrast with a DRAM memory cell circuit which has a single transistor and a storage capacitor, the SRAM memory cell circuit has an electronic latch circuit constructed from two inverter circuits. The area of an SRAM memory cell can be minimized by using a simple latch design. An example of a simple latch design that encompasses a small circuit area is a latch having two transistors and two load resistors. A disadvantage of this circuit is that a high standby current results when the latch has power applied to it. A further complication results if the load resistances are increased to minimize the standby current. Under these circumstances, the latch becomes inherently unstable and the output is unpredictable.

A full CMOS latch contains two N-channel transistors and two P-channel load transistors. The latch can be considered as two inverters with each inverter having one N-channel transistor and one P-channel load transistor. The load current flowing in each inverter is negligible because the inverter has two transistors of opposite conductivity type. Unfortunately, a full CMOS latch design requires a larger area of silicon substrate for the integration of four transistors. In order to achieve the benefits of a full CMOS design, while at the same time achieving a high degree of integration, it is necessary to reduce the area of silicon substrate required to integrate the latch. A process known as "silicon-on-insulator" or SOI process can be used to remove two of the P-channel transistors from the silicon substrate and to form them in a layer of silicon overlying a conventional transistor structure formed in the silicon substrate.

The removal of two P-channel transistors from the silicon substrate reduces the area of silicon substrate required for the integration of the latch. However, the improvements gained are still inadequate as compared with the advances in the degree of integration obtainable in DRAM technology.

SUMMARY OF THE INVENTION

The invention provides an improved electronic plural transistor structure for the purpose of achieving a high degree of integration in integrated circuits. The invention improves the degree of integration of existing transistor structures by structuring a plurality of transistors with shared electrodes. In one form, the invention includes a first pair of transistors of opposite conductivity type coupled in series between two power supply terminals with control electrodes connected together. A second pair of transistors of opposite conductivity type are coupled in series between the two power supply terminals and have a commonly connected control electrode. The control electrodes of the second pair of transistors are comprised substantially of a common region of semiconductor material which is also used to form a predetermined current electrode of the first pair of transistors. These and other features and advantages will be more clearly understood from the following detailed description taken in conjunction with the accompanying drawings.

BRIEF DESCRIPTION OF THE DRAWINGS

FIG. 5 illustrates, in schematic layout form, a transistor structure having shared electrodes in accordance with the present invention.

FIG. 6 illustrates, in schematic layout form, a static latch transistor structure in accordance with another embodiment of the present invention.

FIG. 7 illustrates, in cross-sectional form, a transistor latch having shared electrodes.

DETAILED DESCRIPTION OF THE INVENTION

A memory circuit is constructed from a large number of memory cells and each memory cell typically stores one bit of information. An expression which is independent of patterning resolution for defining the degree of integration used in the design of an integrated circuit is the ratio of the memory cell area to the square of the circuit minimum feature size. From the calculations required to obtain this integration expression, it is readily apparent that the degree of integration used in DRAMs is much greater than that used in SRAMs.

The discrepancy, in the degree of integration, between DRAMs and SRAMs is reduced by this invention. In order to show how the degree of integration of SRAMs can be improved, it is necessary to consider a memory cell circuit.

Figure 1:
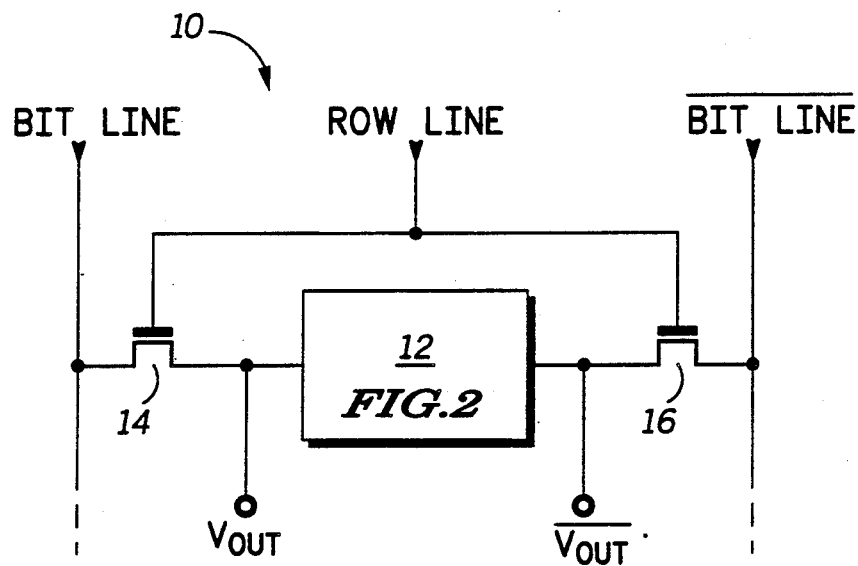
FIG. 1 illustrates, in partial schematic form, a known memory cell.

Shown in FIG. 1 is a known memory cell 10 used in a common SRAM architecture. A static latch 12 has $V_{OUT}$ and $\overline{V_{OUT}}$ terminals and provides a logic storage element for the memory cell. A pair of N-channel transistors 14 and 16 are connected to static latch 12. A source of transistor 14 is connected to a Bit Line conductor of memory cell 10. A gate of transistor 14 is connected to a gate of transistor 16 and to a Row Line conductor of memory cell 10. A drain of transistor 14 is connected to the $\overline{V_{OUT}}$ terminal of static latch 12, and a source of transistor 16 is connected to the $V_{OUT}$ terminal of static latch 12. A drain of transistor 16 is connected to a Bit Line conductor of memory cell 10.

In operation, static latch 12 is selected when memory cell 10 is addressed. Memory cell 10 is addressed when the Bit Line signal and the Row Line signal are each held at a logic high. In large SRAMs, memory cell 10 must be duplicated for each bit storage position implemented. As a result, a large area of silicon substrate is occupied in high density SRAMs.

Figure 2:
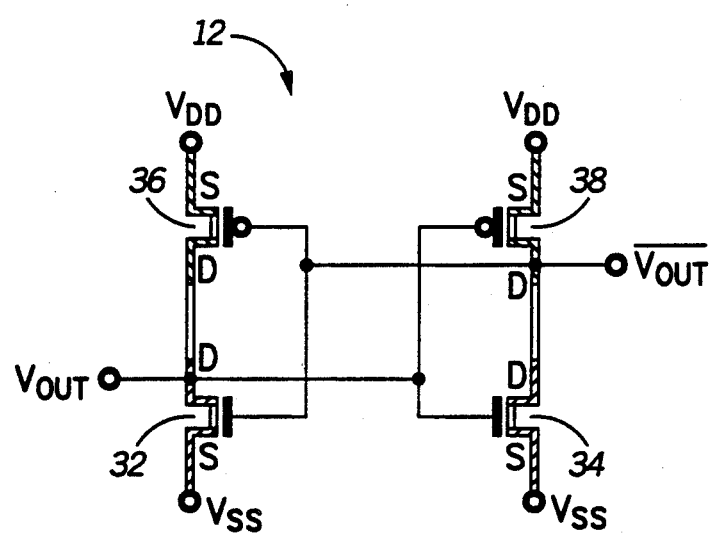
FIG. 2 illustrates, in schematic layout form, a known static latch.

FIG. 2 illustrates, in schematic layout form, the known static latch 12, for use in memory cell 10 of FIG. 1 and having an output $\overline{V_{OUT}}$ and an output $V_{OUT}$. A source of a P-channel transistor 36 is connected to a supply voltage, $V_{DD}$, of the latch. A gate of a transistor 36 is connected to a gate of an N-channel transistor 32 and to a drain of a P-channel transistor 38. A drain of transistor 36 is connected to a drain of transistor 32 and to a gate of an N-channel transistor 34, which is also connected to a gate of transistor 38. A source of transistor 32 is connected to a ground potential, $V_{SS}$. A source of transistor 38 is connected to supply voltage, $V_{DD}$. A source of transistor 34 is connected to ground potential, $V_{SS}$. For emphasis of illustration, the source and drain electrodes of each transistor are cross-hatched.

In operation, either transistor 32 or transistor 34 will be conductive. If transistor 34 is conductive, output $V_{OUT}$ will be approximately at the same potential as $V_{DD}$ and will be sustained at that voltage until the gate of transistor 32 is driven high, at which point transistor 32 will conduct and the binary logic value stored in the latch will change. A primary advantage of latch 12, known as a full CMOS latch, is low standby current and is achieved by using transistors of opposite polarity in series so that current does not continuously flow between $V_{DD}$ and $V_{SS}$. A disadvantage of latch 12 is that a relatively large area of silicon substrate is required for the integration of latch 12 into a memory circuit. A diffused region in the silicon substrate must exist for each cross-hatched area in FIG. 2.

The area of silicon substrate required for the integration of latch 12 can be reduced if P-channel transistors 36 and 38 are formed in a layer of silicon overlying conventional transistors formed in a silicon substrate. A known process "silicon on insulator", SOI, forms P-channel transistors in a silicon layer which overlies an oxidized polysilicon gate electrode. Under these circumstances, the gate electrode mutually controls a transistor formed in the silicon substrate and a transistor formed in the SOI layer.

Figure 3:
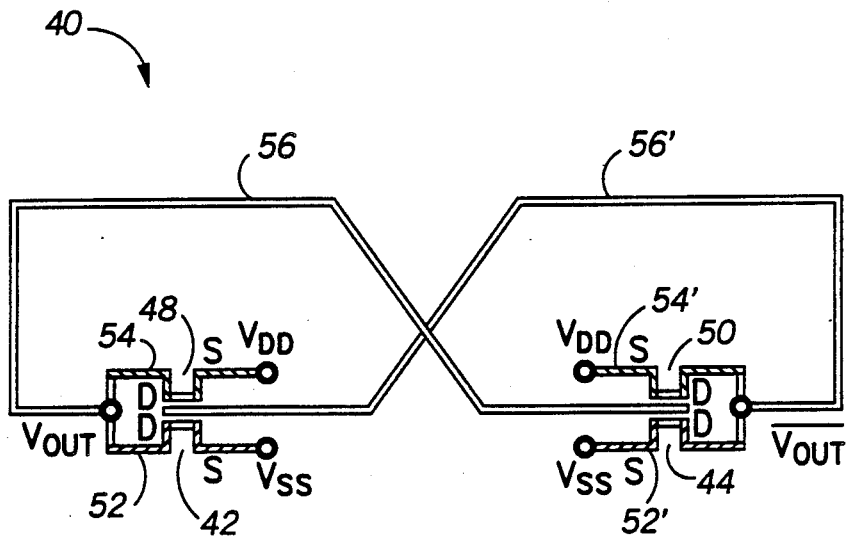
FIG. 3 illustrates, in schematic layout form, a known folded SOI static latch.

FIG. 3 illustrates in schematic layout form a known folded SOI latch 40 having two mutually gated transistor pairs, such as an N-channel transistor 42 which is mutually gated with a P-channel transistor 48 and an N-channel transistor 44 which is mutually gated with a P-channel transistor 50. In an SOI integrated circuit such as latch 40, P-channel transistor 48 is removed from a silicon substrate and formed in an overlying layer of silicon (shown conceptually below in FIG. 4) such as a polysilicon layer 54. Similarly, P-channel transistor 50 is removed from the same silicon substrate and formed in a polysilicon layer 54'. Another layer of polysilicon 56 forms a mutual gate for transistors 44 and 50 and connects to a $V_{OUT}$ terminal. Yet another layer of polysilicon 56' forms a mutual gate for transistors 42 and 48 and connects to a $\overline{V_{OUT}}$ terminal. A source of transistor 42 is connected to a ground potential, $V_{SS}$. A drain of transistor 42 is connected to a drain of transistor 48, to gate 56, and to the $V_{OUT}$ terminal. A source of transistor 48 is connected to a supply voltage, $V_{DD}$. A source of transistor 44 is connected to the ground potential, $V_{SS}$. A drain of transistor 44 is connected to a drain of transistor 50, to a gate 56' and to the $V_{OUT}$ terminal. A source of transistor 50 is connected to $V_{DD}$.

In operation, latch 40 functions in a similar manner to latch 12, which has been previously described. A primary advantage of latch 40 is the improvement in the degree of integration which is enhanced by the removal of P-channel transistors 48 and 50 from the silicon substrate. A disadvantage of latch 40, however, is that a relatively large area of silicon substrate is still required for the integration of latch 40 into a memory cell circuit.

Figure 4:
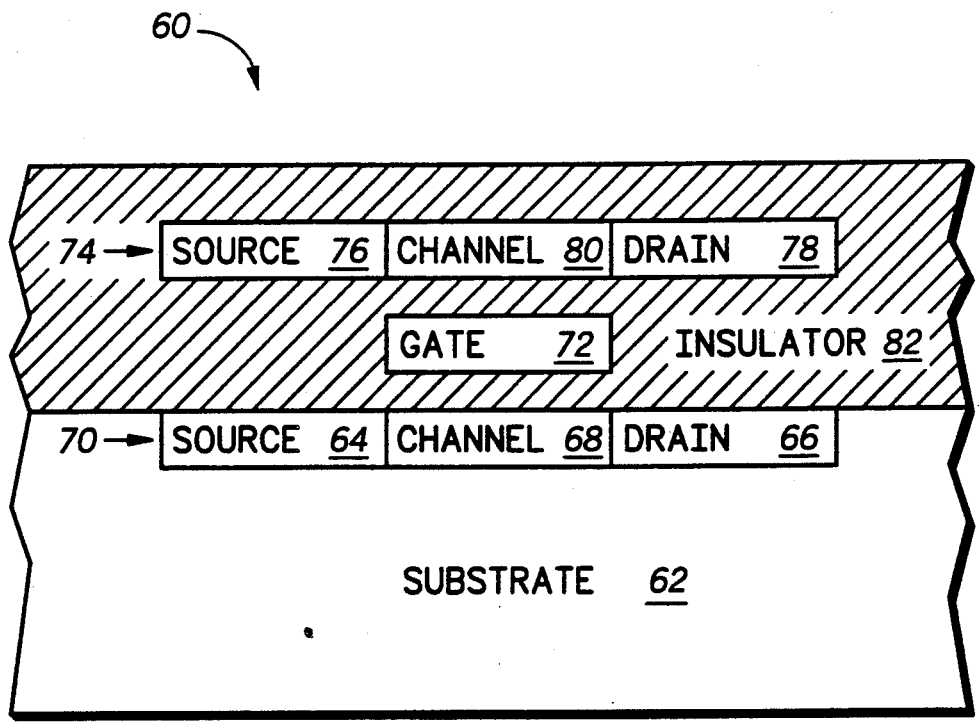
FIG. 4 illustrates, in cross-sectional form, a known SOI semiconductor structure having a mutually gated electrode.

FIG. 4 shows, in cross-sectional form, a known structure 60 suitable for the construction of latch 40 of FIG. 3. A silicon substrate 62 has a source region 64, a drain region 66 and a channel region 68 diffused therein to form a transistor 70. A transistor 74 overlying transistor 70 has a source region 76, a drain region 78 and a channel region 80. A gate region 72 is interposed between transistors 70 and 74 in an insulator 82. Gate region 72 provides a mutual gate electrode for silicon substrate transistor 70 and transistor 74. Insulator 82 provides electrical isolation between transistor 70 and transistor 74.

In operation, gate region 72 mutually controls the current flowing in channel 68 of transistor 70 and the current flowing in channel 80 of transistor 74. A primary disadvantage of structure 60 is that two adjacent structures such as structure 60 are required to form latch 40 of FIG. 3. A latch resulting from a combination of two adjacent structures, as previously described, encompasses a relatively large area of silicon substrate.

FIG. 5 illustrates in schematic layout form a static latch 90 having a plurality of transistors with shared electrodes in accordance with the invention. Latch 90 has $V_{OUT}$ and $\overline{V_{OUT}}$ terminals and provides a logic storage element. A source of an N-channel transistor 92 is connected to a ground potential, $V_{SS}$. A drain of transistor 92 is connected to the $V_{OUT}$ terminal of latch 90 and to a drain of a P-channel transistor 94. A source of transistor 94 is connected to a supply voltage, $V_{DD}$. Drains of an N-channel transistor 96 and a P-channel transistor 98 are connected together and to the $\overline{V_{OUT}}$ terminal. Transistor 98 has a gate formed by the drain of transistor 94 which is formed in the same material. The gate of transistor 98 also serves as a current electrode of transistor 94. Transistor 96 has a gate formed by the drain of transistor 92 which is formed in the same region of material. The arrangement of transistors described herein forms a unique structure in which current electrodes are shared with gate control electrodes. Similarly, transistor 92 has a gate formed by the drain of transistor 96, and transistor 94 has a gate formed by the drain of transistor 98. A source of transistor 98 is connected to supply voltage $V_{DD}$, and a source of transistor 96 is connected to ground potential $V_{SS}$. For emphasis of illustration of the positioning of electrodes in transistors 92, 94, 96 and 98 of latch 90, all transistors electrodes are shown with cross-hatching according to conductivity type and connecting material and channels are not hatched.

In circuit operation, latch 90 functions similarly to latch 12 of FIG. 2 as previously described. Latch 90 is a four-transistor latch which stores a binary logic value. Latch 90 has a high degree of integration and only encompasses a relatively small area of the silicon substrate. Another advantage of latch 90, which has electrodes shared with the same semiconductor material, is an ability to choose which transistor's drain region is shared with a gate electrode. For example, the drain region of transistor 94 can be used to form a gate for transistor 98 as shown in FIG. 5, or the drain region of transistor 92 can form the gate of transistor 98 using a structure which is not shown in FIG. 5. By using shared regions of material in a substrate for more than one electrode function in latch 90, the amount of substrate area is significantly reduced.

FIG. 6 shows another latch 100, in accordance with the invention, also having a plurality of transistors with shared electrodes. Latch 100 has $V_{OUT}$ and $\overline{V_{OUT}}$ terminals and provides a logic storage element. A source of an N-channel transistor 102 is connected to a ground potential, $V_{SS}$. A drain of transistor 102 is connected to the $V_{OUT}$ terminal of latch 100 and to a drain of a P-channel transistor 104. A source of transistor 104 is connected to a supply voltage, $V_{DD}$. A drain of an N-channel transistor 110 and a drain of a P-channel transistor 108 are connected together and to the $\overline{V_{OUT}}$ terminal. A gate of transistor 110 is formed by the same material as the drain of transistor 104, and a gate of transistor 108 is formed by the same material as the drain of transistor 102. A source of transistor 108 is connected to the supply voltage, $V_{DD}$, and a source of transistor 110 is connected to ground potential $V_{SS}$. Again, for emphasis of illustration of the positioning of electrodes in transistors 102, 104, 108 and 110 of latch 100, all transistors electrodes are shown with cross-hatching according to conductivity type and connecting material and channels are not hatched.

In operation, latch 100 is a four transistor latch which stores binary logic values. Latch 100 functions in a similar manner to latch 90 of FIG. 5 with the exception that transistors of opposite conductivity share the same electrode material. Latch 90 used transistors of the same conductivity to share the same electrode material. A consequence of this variation is a resulting change in the threshold voltage of each transistor formed having a gate with a shared electrode material. As with latch 90, latch 100 has a high degree of integration encompassing a relatively small area of silicon substrate.

FIG. 7 shows, in cross-sectional form, a plural transistor structure 120 illustrating the use of shared transistor electrodes by a plurality of transistors. A silicon substrate 122 has a source region 124 and a drain region 126 diffused therein and spaced apart by a channel region 128 to form a transistor 130. A polysilicon gate 134 overlies channel 128, is surrounded by an insulator 148, and provides an independent control electrode for transistor 130. A transistor 136 has a drain region 138, a source region 140 and a channel region 142 formed in a polysilicon layer provided in insulator 148 and overlying transistor 130. Insulator 148 provides electrical isolation between transistor 130 and transistor 136. Another transistor 150 overlies transistor 136 and is formed in a further polysilicon layer provided in insulator 148. Transistor 150 has a source region 152, a drain region 156, a channel region 154 and a gate provided by drain 138 of transistor 136. The gate of transistor 136 is provided by drain 156. Transistor 136 provides a gate control function for transistor 150 with drain region 138, and transistor 150 provides a gate control function for transistor 136 with drain region 156. Conducting layers and their associated contacts or vias are not illustrated in FIG. 7 in order to show more clearly the plural transistor structure 120 having shared electrodes.

In the illustrated form, transistor structure 120 has two layers (i.e. transistors 136 and 150) of SOI overlying the silicon substrate 122. Since transistor 136 has a gate formed by drain region 156 of transistor 150, a very significant reduction in layout area required to integrate transistor structure 120 is achieved. The plural transistor structure 120 has an advantage of encompassing a relatively very small area of silicon substrate, which is substantially one-half that of latch 40 of FIG. 3.

Figure 8:
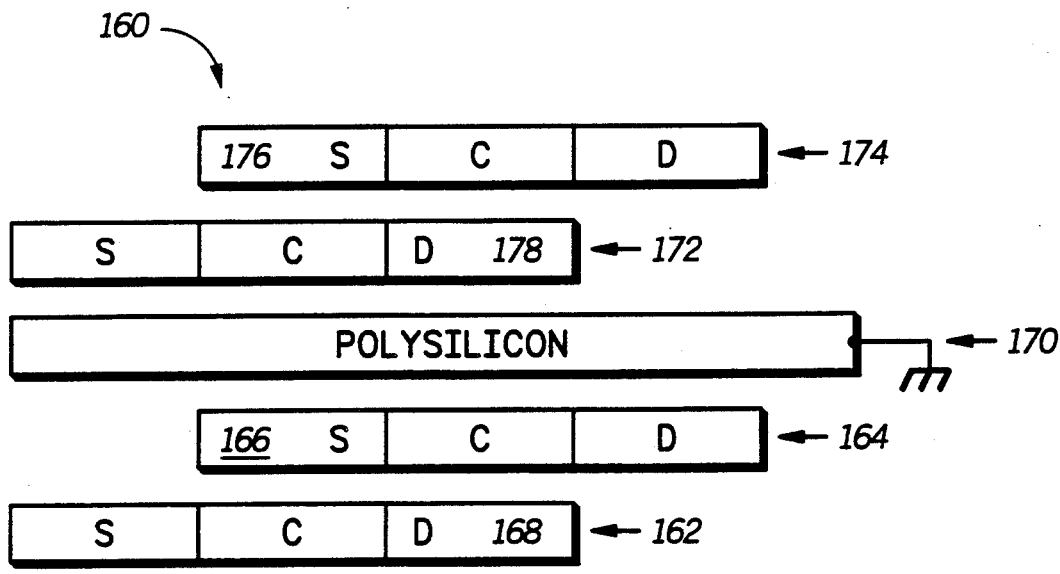
FIG. 8 illustrates, in spatial diagrammatic form, a plurality of transistor structures with shared electrodes.

FIG. 8 illustrates in spatial diagrammatic form, in accordance with another form of the invention, a plurality of transistors 160 having transistors 162, 164, 172 and 174 formed in multiple overlying SOI layers. Transistor 162 has a gate formed by a source 166 of transistor 164. Transistor 164 has a gate formed by a drain 168 of transistor 162. Transistor 172 has a gate formed by a source 176 of transistor 174. Transistor 174 has a gate formed by a drain 178 of transistor 172. An electrical screening layer 170, which is held at ground potential, electrically isolates transistor 164 from transistor 172. Additional layers can be overlaid to form a structure with a very high degree of integration.

In the illustrated form, a current electrode such as drain 168 forms a control gate for transistor 164 which is a structure with shared electrodes. SOI layers can be electrically isolated from each other by the use of screening plates, such as screening layer 170 which are held at ground potential. It should be noted that electrically isolating transistors 162, 164, 172 and 174 in a vertical structure has numerous manufacturing advantages as compared to lateral structures of multiple electrically isolated transistors. In the present invention, any number of multiple overlying SOI layers of transistors may be implemented wherein some or all pairs of the transistors use the same semiconductor material to implement two different transistor electrodes having two different functions (i.e. bias control versus current conduction).

Figure 9:
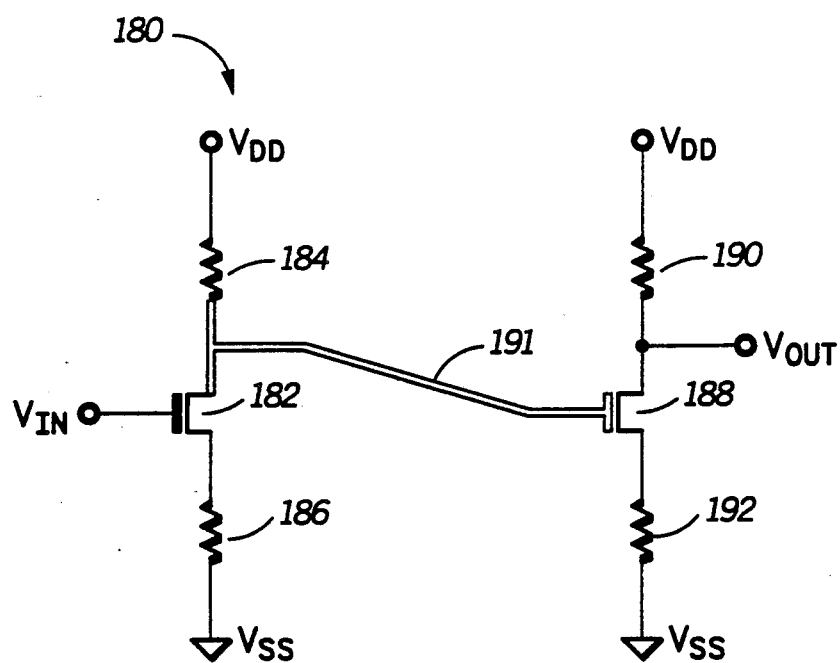
FIG. 9 illustrates, in schematic form, a known direct-coupled transistor amplifier.

FIG. 9 illustrates, in schematic form, a known direct-coupled, two-stage amplifier circuit 180 with a $V_{IN}$ terminal and a $V_{OUT}$ terminal. A gate of an N-channel transistor 182 is connected to a $V_{IN}$ terminal. A source of transistor 182 is connected through a bias resistor 186 to a ground potential, $V_{SS}$. A drain of transistor 182 is connected through a load resistor 184 to a supply voltage, $V_{DD}$, and to a gate of an N-channel transistor 188. A conductor 191 directly couples the drain of transistor 182 to the gate of transistor 188. A drain of transistor 188 is connected to the V$_{OUT}$ terminal and through a load resistor 190 to a supply voltage, V$_{DD}$. A source of transistor 188 is connected through a bias resistor 192 to a ground potential, V$_{SS}$.

Transistor 182 is typically directly coupled to transistor 188 by a conductor. The stray capacitance of the conductor 191 is important to circuit performance such as speed. In contrast, the present invention as described herein may be used to directly couple transistor 182 to transistor 188 by forming the gate of transistor 188 from the drain of transistor 182. Elimination of a capacitive connection between two transistors with the present invention improves both speed and the degree of integration.

Figure 10:
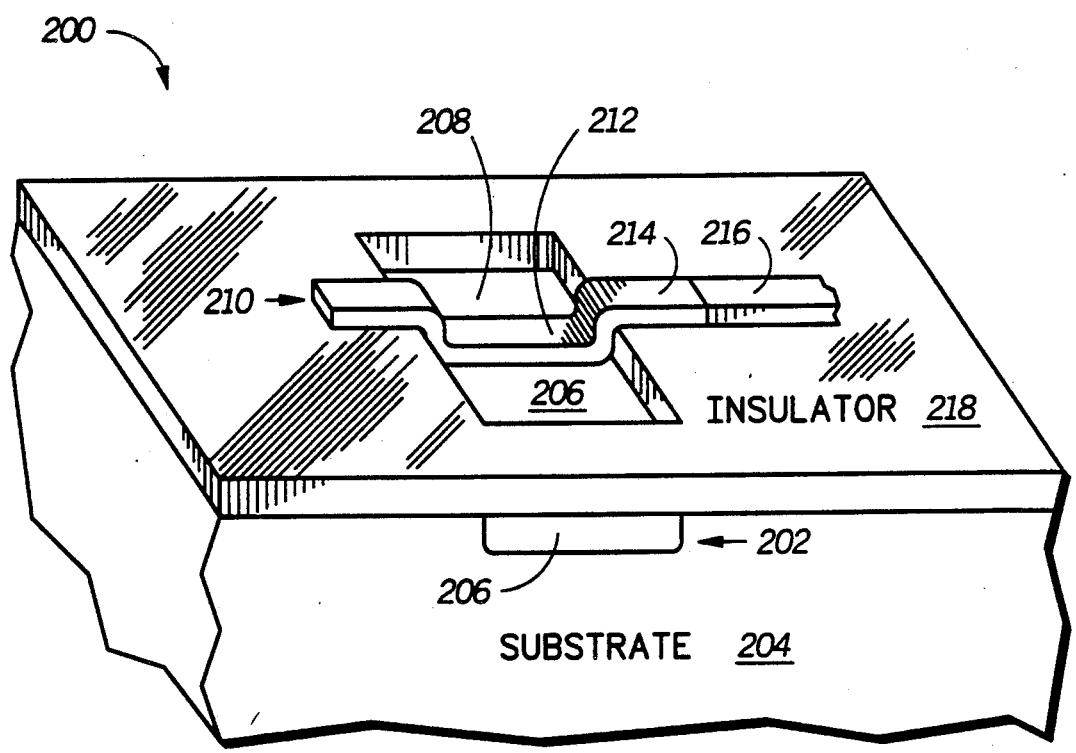
FIG. 10 illustrates, in cross-sectional form, a plural transistor structure having shared electrodes.

Illustrated in FIG. 10, in a perspective cross-sectional form, is a plural transistor structure 200 having shared electrodes according to the present invention. A substrate transistor 202 is formed in a silicon substrate 204. Transistor 202 has a source region 206, a drain region 208 and a channel region underlying a source electrode 212 of an SOI transistor 210. A gate of transistor 202 is formed with the source electrode 212 of SOI transistor 210. Transistor 210 has source electrode 212, a channel region 214 and a drain region 216. Transistor 210 is electrically isolated from the silicon substrate 204 by an insulator 218.

In the illustrated form, a device formed by structure 200 encompasses a relatively small area of the integrated circuit. A direct coupling of transistors as discussed with FIG. 9, is provided by a shared gate control electrode. The advantage of direct coupling is low stray capacitance, which is a result of forming the gate of transistor 188 with exactly the same region of material as source 212. Structure 200, can be particularly useful when integrated in other semiconductor materials such as gallium arsenide and conductive polymers.

By now it should be apparent that there has been provided a transistor structure which, improves the degree of integration of integrated circuits, especially SRAMs. The improvement in the degree of integration is achieved by forming transistor gate electrodes from transistor current electrodes in exactly the same region of semiconductor material. The invention offers several other advantages such as an ability to select the conductivity of the electrode material of the drain, such as an N-doped or P-doped region. Another advantage of the invention is an ability to directly couple transistors to reduce stray capacitance and thereby improve circuit speed. It should be apparent that this invention is not restricted to MOS transistors but can be implemented with all other types of transistors such as bipolar transistors or junction field effect transistors and with other semiconductor devices having control electrodes.

While there have been described herein the principles of the invention, it is to be clearly understood by those skilled in the art that this description is made only by way of example and not as a limitation to the scope of the invention. For example, the substrate or the electrodes need not necessarily be of silicon but may also a material such as gallium arsenide. The electrodes may also be of a material other than polysilicon such as a conducting polymer. Accordingly, it is intended, by the appended claims, to cover all modifications of the invention which fall within the true spirit and scope of the invention.

I claim:

1. In an integrated circuit, a method of structuring a plurality of transistors with shared electrodes, comprising the steps of:

providing a substrate material having a predetermined substrate conductivity and a surface;

forming a first transistor by forming first and second current electrode regions within the substrate material and which are separated by a control electrode overlying the surface of the substrate material, the control electrode controlling only the first transistor;

forming an insulator overlying the first transistor and completely surrounding the control electrode; and forming a pair of transistors with second and third transistors, each of the second and third transistors overlying the control electrode of the first transistor and being contained within the insulator, each of the second and third transistors having first and second current electrodes and a control electrode, the control electrode of the second transistor being formed from a substantially identical region of semiconductor material used to form the second current electrode of the third transistor, the control electrode of the second transistor having a predetermined conductivity type with respect to the first and second current electrodes of the third transistor for adjusting threshold voltages of the second and third transistors independent of a threshold voltage of the first transistor and the predetermined substrate conductivity.

2. The method of claim 1 wherein the step of forming the pair of second and third transistors further comprises forming the control electrode of the second transistor with a same conductivity as the first and second current electrodes of the third transistor.

3. The method of claim 1 wherein the step of forming the pair of second and third transistors further comprises forming the control electrode of the second transistor with an opposite conductivity as the first and second current electrodes of the third transistor.

4. An integrated circuit having a plural transistor structure with shared electrodes comprising:

a substrate material having a predetermined substrate conductivity and a surface;

a first transistor by forming first and second current electrode regions within the substrate material and which are separated by a control electrode overlying the surface of the substrate material, the control electrode controlling only the first transistor an insulator overlying the first transistor and completely surrounding the control electrode; and a pair of transistors with second and third transistors, each of the second and third transistors overlying the control electrode of the first transistor and being contained within the insulator, each of the second and third transistors having first and second current electrodes and a control electrode, the control electrode of the second transistor being formed from a substantially identical region of semiconductor material used to form the second current electrode of the third transistor, the control electrode of the second transistor having a predetermined conductivity type with respect to the first and second current electrodes of the third transistor for adjusting threshold voltages of the second and third transistors independent of a threshold voltage of the first transistor and the predetermined substrate conductivity.

5. The integrated circuit of claim 4 wherein the control electrode of the second transistor is formed with a same conductivity as the first and second current electrodes of the third transistor.

6. The integrated circuit of claim 4 wherein the control electrode of the second transistor is formed with a conductivity opposite a conductivity of the first and second current electrodes of the third transistor.

* * * * *